(12) United States Patent
Chryssis et al.

(10) Patent No.: US 10,539,805 B2
(45) Date of Patent: Jan. 21, 2020

(54) ABERRATION COMPENSATED DIODE-LASER STACK

(71) Applicant: Coherent, Inc., Santa Clara, CA (US)

(72) Inventors: Athanasios Chryssis, Santa Clara, CA (US); Geunmin Ryu, San Jose, CA (US); David Schleuning, Oakland, CA (US)

(73) Assignee: Coherent, Inc., Santa Clara, CA (US)

( * ) Notice: Subject to any disclaimer, the term of this patent is extended or adjusted under 35 U.S.C. 154(b) by 188 days.

(21) Appl. No.: 15/414,906

(22) Filed: Jan. 25, 2017

(65) Prior Publication Data

US 2017/0212355 A1 Jul. 27, 2017

Related U.S. Application Data

(60) Provisional application No. 62/287,761, filed on Jan. 27, 2016.

(51) Int. Cl.
*G02B 27/12* (2006.01)
*H01S 5/00* (2006.01)
*H01S 5/40* (2006.01)

(52) U.S. Cl.
CPC ......... *G02B 27/123* (2013.01); *H01S 5/0071* (2013.01); *H01S 5/4012* (2013.01); *H01S 5/4025* (2013.01)

(58) Field of Classification Search
CPC ...... G02B 19/0014; G02B 2006/12102; G02B 19/0057; G02B 27/0025; G02B 27/0961; G02B 27/123; H01S 3/067; H01S 3/10; H01S 5/4025; H01S 5/0071; H01S 5/4012
See application file for complete search history.

(56) References Cited

U.S. PATENT DOCUMENTS

| 6,594,299 B1 * | 7/2003 | Hirano ................. H01S 3/0941 372/69 |
| 7,277,229 B2 * | 10/2007 | Kato .................. G02B 27/0905 359/618 |
| 8,602,592 B2 | 12/2013 | Kuchibhotla et al. |
| 2008/0101429 A1 * | 5/2008 | Sipes .................. G02B 6/4296 372/50.12 |
| 2014/0098534 A1 | 4/2014 | Jackson |

FOREIGN PATENT DOCUMENTS

| EP | 2450737 A2 | 5/2012 |
| WO | 2000/60399 A1 | 10/2000 |
| WO | 2007/078456 A1 | 7/2007 |

OTHER PUBLICATIONS

International Search Report and Written Opinion received for PCT Application No. PCT/US2017/014850, dated May 4, 2017, 12 pages.

(Continued)

*Primary Examiner* — Joseph P Martinez
*Assistant Examiner* — Vipin Patel
(74) *Attorney, Agent, or Firm* — Morrison & Foerster LLP

(57) ABSTRACT

Optical output beams from a vertical stack of diode-laser bars are focused by a simple focusing lens on an optical axis of the lens. The optical output beams from outlying diode-laser bars in the vertical stack are tilted with respect to the optical axis of the focusing lens such that optical output from the whole vertical stack is brought to a common focus location on the optical axis of the focusing lens.

10 Claims, 4 Drawing Sheets

(56) References Cited

OTHER PUBLICATIONS

Jiang et al., "Beam-Shaping Method for Uniform Illumination by Superposition of tilted Gaussian Beams", Optical Engineering, vol. 49, No. 4, Apr. 2010, pp. 044203-1-044203-5.
Shangguan et al., "Beam-Shaping of Laser Diode Stack for Uniform Illumination by Cylindrical Micro-Lenses", Proc. of SPIE, vol. 7844, 2010, pp. 784405-1-784405-6.

* cited by examiner

ABERRATION COMPENSATED DIODE-LASER STACK

PRIORITY

This application claims priority to U.S. Provisional Patent Application No. 62/287,761, filed Jan. 27, 2016, the entire disclosure of which is incorporated herein by reference.

TECHNICAL FIELD OF THE INVENTION

The present invention relates in general to focusing optical output from diode-laser bars. The invention relates in particular to focusing optical output from stacked diode-laser bars using a single-element lens.

DISCUSSION OF BACKGROUND ART

Diode-lasers are efficient devices for converting electrical power into coherent optical power. In this respect, they represent the most efficient class of laser devices. An edge-emitting diode-laser has a diode-laser emitter grown on a single-crystal substrate. The diode-laser emitter emits laser-radiation through an end-facet in an emission direction. For high-power applications, diode-laser bars having a plurality of such diode-laser emitters provide a convenient way to scale optical power. In a diode-laser bar, individual diode-laser emitters are formed in a plurality of epitaxially grown semiconductor layers on a single-crystal substrate. A typical diode-laser bar has a linear array of such diode-laser emitters that generate a corresponding plurality of individual optical beams propagating in the emission direction.

Commercial diode-laser bars are usually "packaged" into assemblies that also include electrical connectors and a base element. The base element includes features for mechanical mounting and provides cooling. In a "conductively cooled package" the base element has sufficient mass to remove waste heat from the diode-laser bar. For higher power operation, the base element is typically water-cooled, for example through a micro-channel arrangement.

The optical beam from an individual diode-laser emitter is divergent in a slow-axis direction and highly-divergent in an orthogonal fast-axis direction. Typically, the optical beams of all the emitters along a diode-laser bar are collimated in the fast-axis direction by a single high-power cylindrical lens, called a "fast-axis collimating lens". The fast-axis collimating lens is located directly in front of the diode-laser emitters and extends along the width of the bar to capture all of the optical power. Typically, slow-axis collimation is achieved using a single-optical element shaped into a linear array of cylindrical micro-lenses. The pitch of the lens array matches the spacing between diode-laser emitters. The slow-axis collimating element is located to intercept all of the optical power transmitted by the fast-axis collimating lens.

For further power scaling, a plurality of diode-laser bar assemblies are stacked together "vertically" to make a two-dimensional array of diode-laser emitters. Such a diode-laser stack can produce kilowatts (kW) of optical power. Optical output from the entire diode-laser stack is approximately collimated in both the fast-axis and slow-axis directions by above-discussed collimating-lens elements in front of each diode-laser bar. Electrically connecting all the diode-laser bar assemblies in series enables the whole stack to be driven from one current source. Similarly, stacking the diode-laser bar assemblies enables the whole stack to be cooled in parallel by a single source of cooling water.

Diode-laser stacks are utilized in diverse applications, including laser welding, heat treatment of metals (hardening and cladding), medical therapies, and pumping of other solid-state lasers. Many of these applications benefit from tight focusing of the optical output from the stack. For example, diode-laser stacks are an optical pump source for high-power fiber resonators and amplifiers. However, pump-light from a diode-laser stack must be focused into a pump-cladding with a diameter on the order of 100 micrometers (μm) to 1 millimeter (mm). Ideally, a single-element lens would be used to focus the optical output from a stack to a tight focus. However, single-element lenses fabricated by conventional methods have optical aberrations. Spherical aberration, in particular, degrades the focusing of lenses that have large diameter relative to focal length. Such a large diameter lens is typically required to capture all light from a diode-laser stack. Spherical aberration accordingly limits the power scaling that can be achieved by stacking additional diode-laser bar assemblies.

Corrective phase-plates are a commonly used means for overcoming spherical aberration. Corrective phase-plates are customized by an expensive process that involves precise wave-front characterization of the optical output of a diode-laser stack, then fabrication of a specific phase-plate element. Alternatively, large-aperture aspheric lenses that are comparable in size to a diode-laser stack can be fabricated free of spherical aberration. However, such large aspheric lenses are expensive, becoming a significant fraction of the cost of a complete diode-laser stack light-source. There is need for an improved diode-laser stack producing optical output that can be tightly focused by a simple and inexpensive single-element lens.

SUMMARY OF THE INVENTION

In one aspect, optical apparatus in accordance with the present invention comprises a stacked plurality of diode-laser bars. Each diode-laser bar has an optical output beam that is substantially collimated in a fast-axis direction of the diode-laser bar by a fast-axis collimating lens. A focusing lens is provided having an optical axis and spherical aberration. The focusing lens intercepts the substantially-collimated beams of all of the diode-laser bars. The stacked diode-laser bars and the focusing lens are arranged to bring all of the substantially-collimated beams to focus on the optical axis. The substantially-collimated beams of at least one of the diode-laser bars are tilted at angles with respect to the optical axis. The respective tilt angles are selected such that all of the focused beams converge to a common focus location on the optical axis.

The term "substantially collimated" as used in this description and the appended claims recognizes that exact fast-axis collimation of an optical output beam is not possible because of aberrations, particularly spherical aberration in the fast-axis collimating lens. Exact slow-axis collimation is also not possible because a diode-laser emitter is spatially extended and highly multi-mode in a slow axis direction. Rays in a substantially-collimated beam may diverge or converge up to about 1 milli-radian (mrad) half-angle in the fast-axis direction and diverge up to about 20 mrad half-angle in the slow axis direction.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1A:
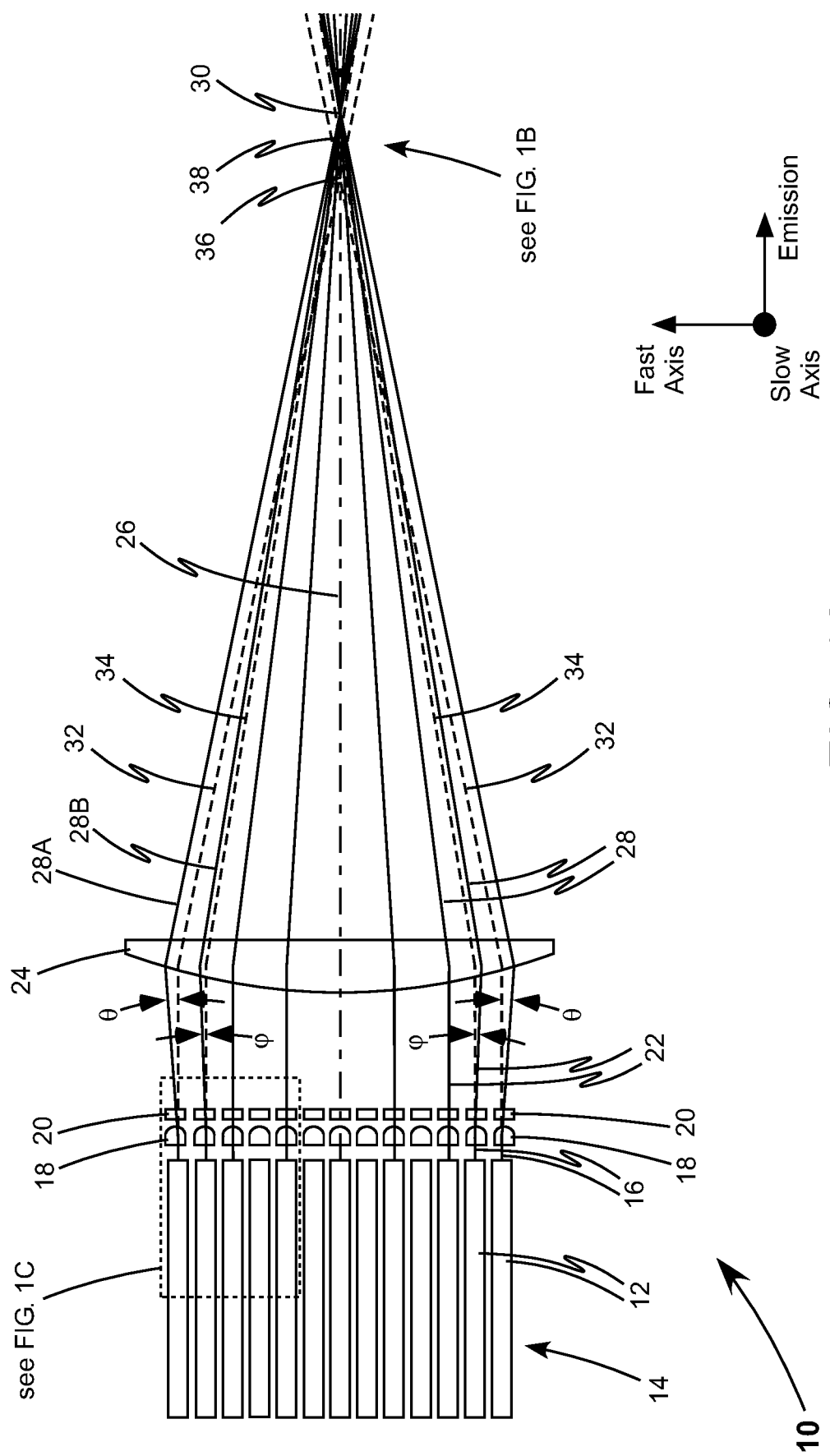
FIG. 1A is a side-elevation view in cross-section schematically illustrating one preferred embodiment of optical apparatus in accordance with the present invention, wherein aberration imparted by a lens that focuses beams originating from a plurality of stacked diode-laser bars is compensated by selectively displacing fast-axis collimating lenses, thereby selectively tilting substantially-collimated beams incident on the lens.

Referring now to the drawings, wherein like components are designated by like numerals, FIG. 1A schematically illustrates one preferred embodiment of optical apparatus 10 in accordance with the present invention. Apparatus 10 comprises a plurality of diode-laser bars 12 arranged to form a vertical stack 14 thereof. Although thirteen diode-laser bars are depicted, there may be more or less diode-laser bars in vertical stack 14, without departing from the spirit and scope of the present invention. Each diode-laser bar 12 has characteristic slow-axis, fast-axis, and emission directions as indicated in the drawing. Each diode-laser bar 12 produces an optical output beam 16 that propagates in the emission direction. The output beams from some of the diode-laser bars have been omitted from the drawing for clarity.

Each output beam 16 is substantially collimated by a fast-axis collimating lens 18 and a slow-axis collimating lens 20, which are located as depicted in output beam 16 and close to diode-laser bar 12. Fast-axis collimating lens 18 substantially collimates output beam 16 in the fast-axis direction and slow-axis collimating lens 20 substantially collimates output beam 16 in the slow-axis direction. In some applications for which output beam 16 has sufficiently-low divergence in the slow-axis direction, slow-axis collimating lens 20 may be omitted, without departing from the spirit and scope of the present invention. Diode-laser bar 12, fast-axis collimating lens 18, and slow-axis collimating lens 20 may be discrete components or incorporated into a diode-laser bar assembly.

Prior-art designs would have all of the diode-laser bars stacked in parallel and all of the substantially-collimated beams propagating parallel to the emission direction. In contrast, apparatus 10 has the substantially-collimated beam originating from each one of the outermost diode-laser bars of the vertical stack propagating at an angle θ from the emission direction. Apparatus 10 also has the substantially-collimated beam originating from each one of the next-outermost diode-laser bars of the vertical stack propagating at an angle φ from the emission direction.

A focusing lens 24 having an optical axis 26 is arranged to intercept all substantially-collimated beams 22. Focusing lens 24 transforms each substantially-collimated beam 22 into a focused beam 28. All focused beams 28 converge to a common focus location 30 on optical axis 26. Focusing lens 24 is depicted as a plano-convex lens, having one flat surface and one spherically-shaped surface. Large plano-convex lenses are easier and cheaper to fabricate than large aspheric lenses or multi-element lenses. However, large plano-convex lenses have spherical aberration, which degrades focusing.

In prior art designs, spherical aberration would displace the focus locations for focused beams originating from diode-laser bars that are remote from the optical axis. Dashed lines in the drawing depict schematically propagation and focusing of beams in prior-art designs. For example, focused beams 32 and 34 originating from respectively the outermost diode-laser bars and the next-outermost diode-laser bars would converge at locations 36 and 38. Although focused beams originating from all of the off-axis diode-laser bars would be displaced from common focus location 30, displacements would be greater for focused beams originating from diode-laser bars further from the optical axis. In contrast, apparatus 10 has ideal focusing, whereby all focused beams 28 converge to common focus location 30. Tilting the substantially-collimated beams originating from the outermost and next-outermost diode-laser bars with respect to optical axis 26 compensates for aberrations imparted by focusing lens 24.

Figure 1B:
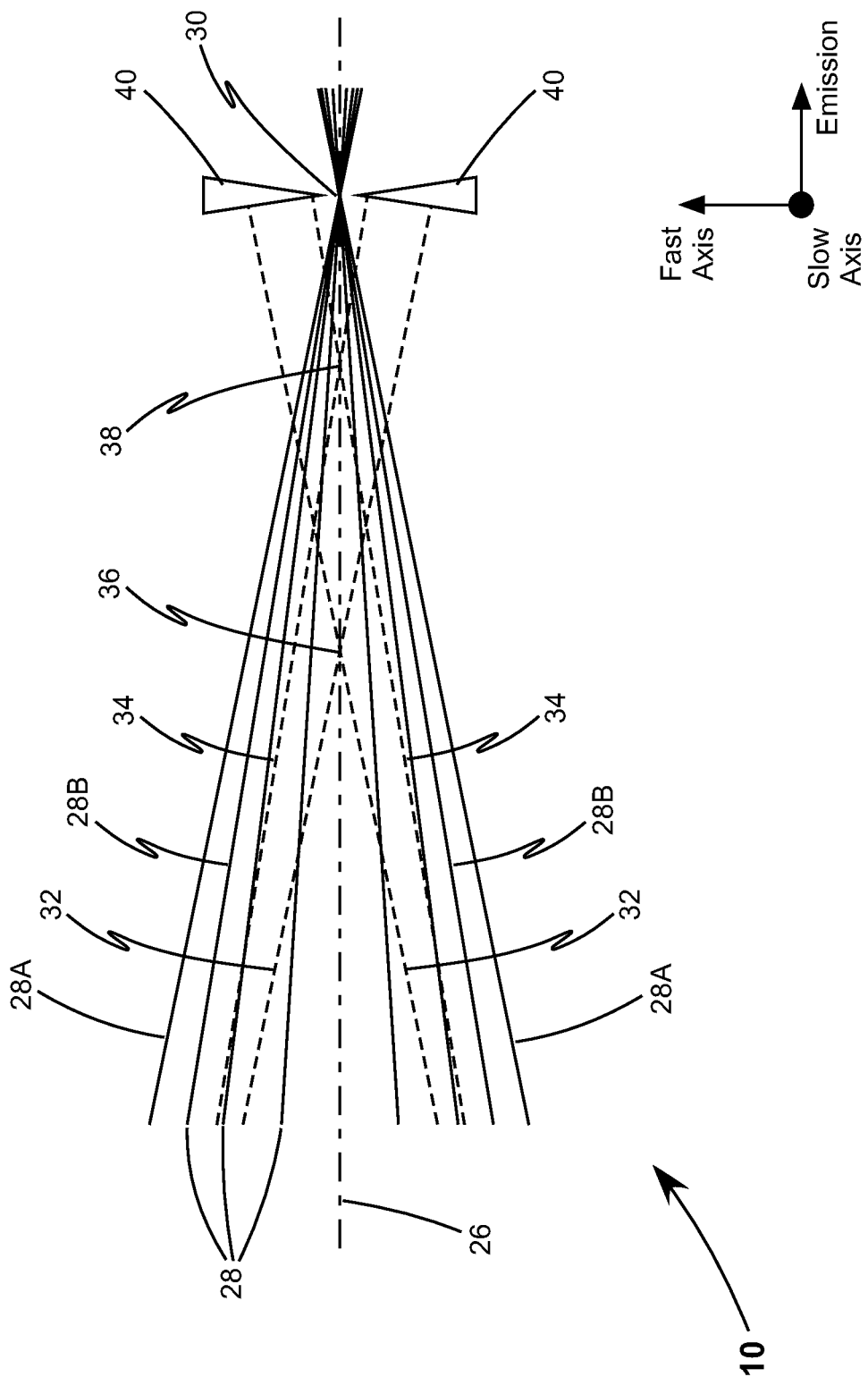
FIG. 1B schematically illustrates detail near a common focus location of the preferred embodiment of optical apparatus in FIG. 1A.

FIG. 1B schematically illustrates detail of apparatus 10 near common focus location 30. All focused beams 28 in apparatus 10, including those focused beams originating from the outermost diode-laser bars 28A and next-outermost diode-laser bars 28B, converge to common focus location 30. In contrast, without compensation for aberration imparted by focusing lens 24, outermost focused beams 32 and next-outermost focused beams 34 would be focused to locations 36 and 38, respectively. To illustrate an advantage of apparatus 10, a virtual aperture 40 is located about common focus location 30. All focused beams 28 fall inside aperture 40. In contrast, focused beams 32 and 34 of prior-art designs would be stopped by aperture 40. By way of example, aperture 40 could represent the outside diameter of a pump cladding in an optical gain fiber. Apparatus 10 provides efficient diode-laser pumping of such a gain fiber since all focused beams 28 incident on an end facet thereof would be incident on the pump cladding.

Figure 1C:
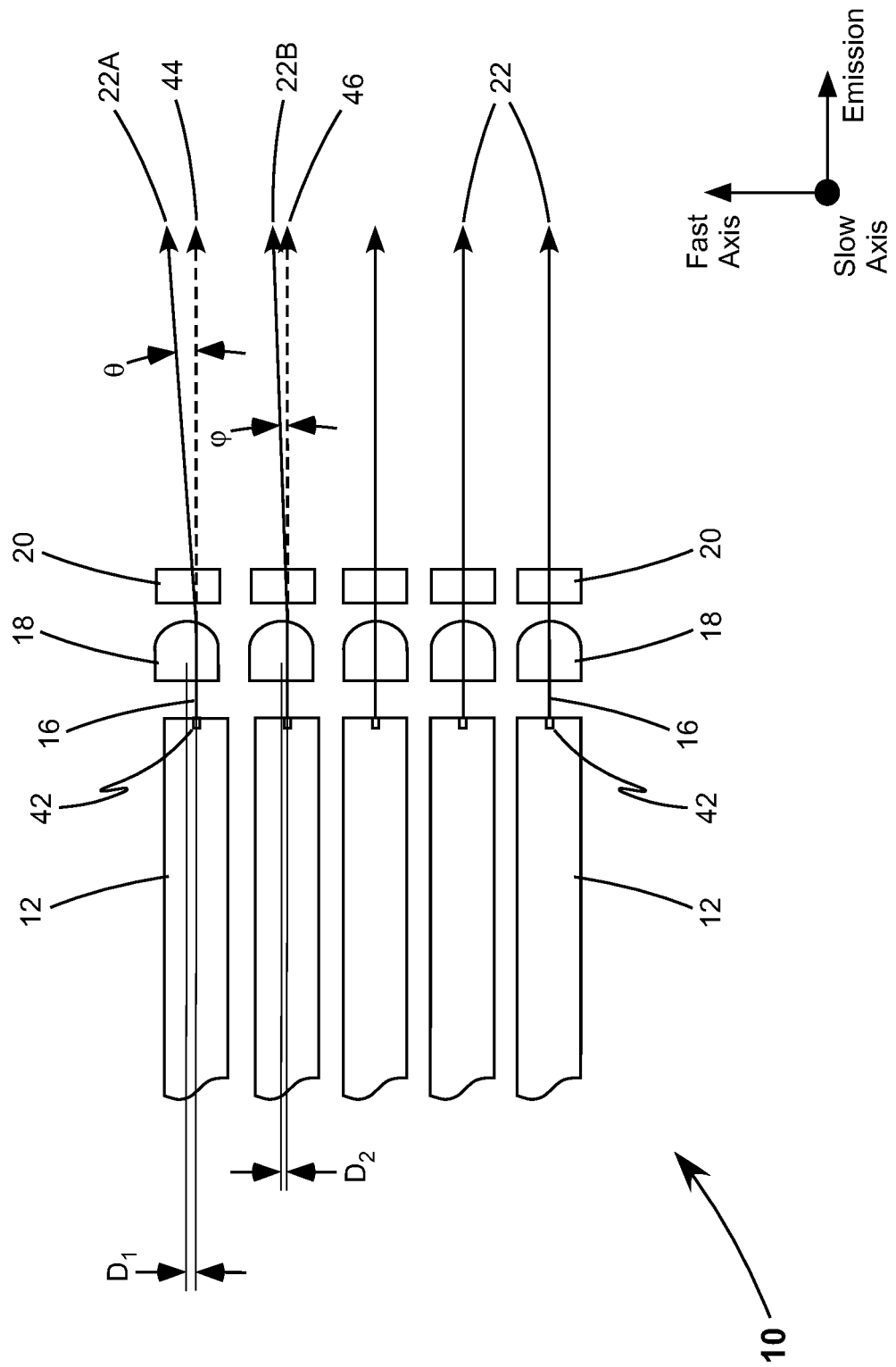
FIG. 1C schematically illustrates detail near outermost diode-laser bars of the preferred embodiment of optical apparatus in FIG. 1A.

FIG. 1C schematically illustrates detail near the outermost diode-laser bars of the vertical stack. Each diode-laser bar 12 includes a plurality of diode-laser emitters 42 located at one end of each diode-laser bar 12. One such diode-laser emitter 42 is visible in each diode-laser bar 12 in the cross-sectional view of the drawing. Tilting by angle θ of substantially-collimated beam 22A originating from the outermost diode-laser bar is achieved by displacing the outermost fast-axis lens laterally by distance $D_1$ with respect to the diode-laser emitters. Tilting by angle φ of substantially-collimated beam 22B originating from the next-outermost diode-laser bar is achieved by displacing the next-outermost fast-axis lens laterally by distance $D_2$ with respect to the diode-laser emitters. In this case angle θ and the resulting distance $D_1$ are greater than angle φ and the resulting distance $D_2$.

In contrast, prior art designs have all the fast-axis lenses aligned with the corresponding diode-laser emitters. Dashed lines in the drawing schematically depict propagation of beams in such prior-art designs. Specifically, substantially-collimated beams 44 and 46 originating respectively from the outermost diode-laser bar and the next-outermost diode-laser bars would propagate in the emission direction.

By way of example, consider a vertical stack of eighteen parallel diode-laser bars generating a plurality of output beams at a wavelength of 976 nm (nanometers). Each diode-laser bar has nineteen diode-laser emitters. There is 500 µm pitch between adjacent diode-laser emitters and 3 mm pitch between adjacent diode-laser bars. The vertical stack is therefore two-dimensional array of emitters that is much taller than it is wide. The output beams are formed into a plurality of substantially-collimated beams. All of the substantially-collimated beams are focused by a commercial fused-silica plano-convex lens (Thorlabs Part Number LA4795) having a diameter of 75 mm and a focal length of 200 mm. An application requires all of the focused beams to be transmitted through a circular aperture having a diameter of 600 µm. The aperture is centered on the principal focus of the lens, which is common focus location 30 in FIGS. 1A and 1B.

The substantially-collimated beams from the outermost and next-outermost diode-laser bars respectively propagate at a distance of about 25.5 mm and 22.5 mm from the optical axis of the lens. Without aberration compensation, focused beams 32 and 34 respectively converge on the optical axis at locations 36 and 38, approximately 0.50 mm and 0.23 mm from the principal focus. A significant fraction of the optical power is stopped by the aperture and the application is thereby deprived of optical power.

In contrast, displacing the corresponding fast-axis collimating lenses laterally to tilt substantially-collimated beams 22A and 22B in FIG. 1C by angles of approximately 2.0 mrad (θ) and 1.0 mrad (φ), respectively, provides sufficient compensation to achieve acceptable focusing. Acceptable focusing is defined, here, as substantially all the available optical power being delivered to the application. Devices comprising more diode-laser bars or devices having a shorter focal-length focusing lens may require tilting of more of the substantially-collimated beams to achieve acceptable focusing. Although this example uses a spherical focusing lens, cylindrical focusing optics may be used instead without departing from the spirit and scope of the present invention.

Figure 2:
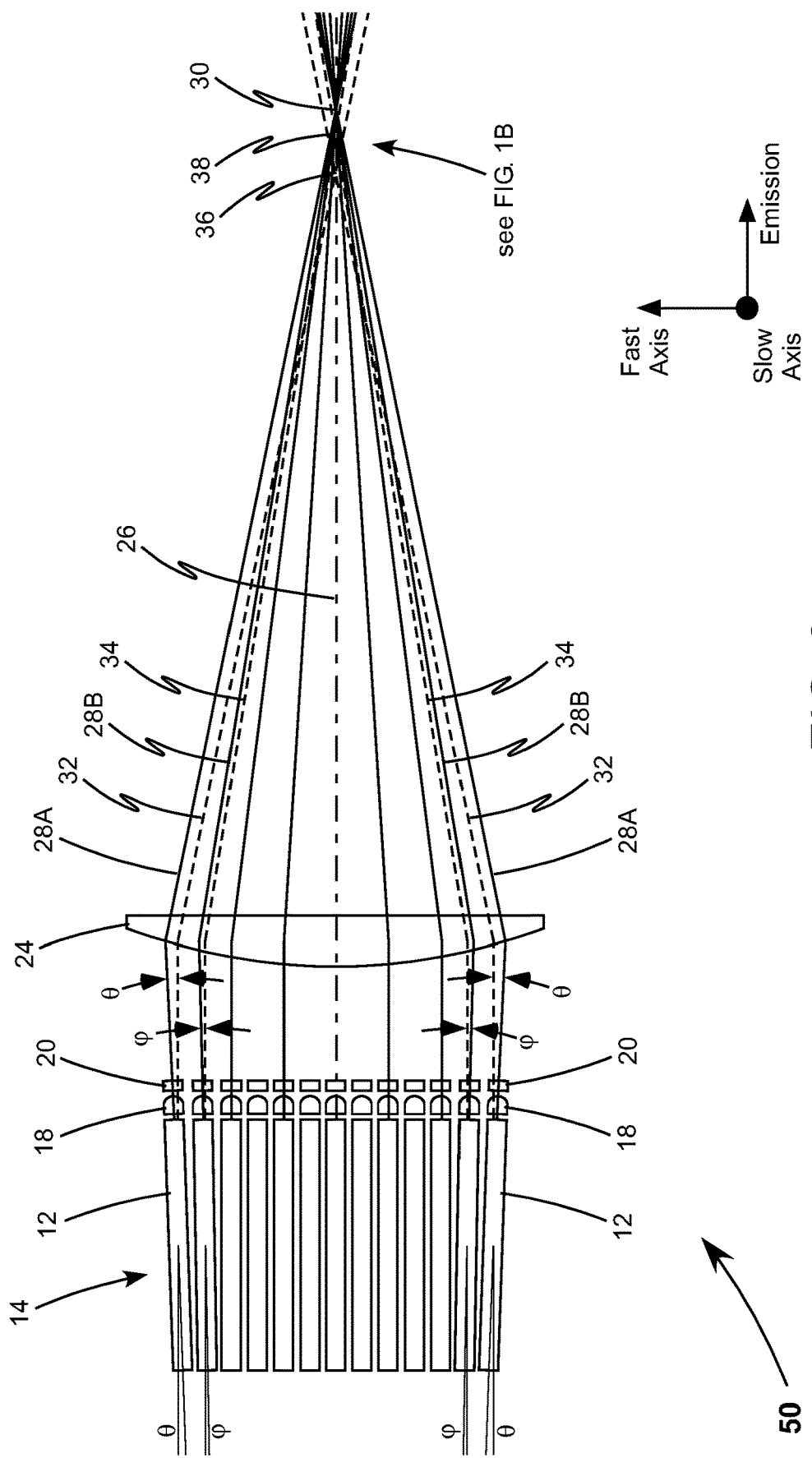
FIG. 2 schematically illustrates another preferred embodiment of optical apparatus in accordance with the present invention, similar to the embodiment of FIG. 1A, but wherein aberration imparted by a focusing lens is compensated by selectively tilting diode-laser bar assemblies.

FIG. 2 schematically illustrates another preferred embodiment 50 of optical apparatus in accordance with the present invention. Apparatus 50 is particularly useful for focusing beams from a plurality of stacked diode-laser bar assemblies. Each diode-laser bar assembly includes a diode-laser bar 12, a fast-axis collimating lens 18, and a slow-axis collimating lens 20, as discussed above. Typically, a diode-laser bar assembly is manufactured to precisely and consistently align the substantially-collimated beam with respect to mechanical elements of the assembly. Therefore, all the substantially-collimated beams from a parallel stack of diode-laser bar assemblies would propagate in parallel. As above, dashed lines in the drawing depict beams originating from the outermost and next-outermost diode-laser bar assemblies in prior-art designs.

In contrast, apparatus 50 achieves aberration compensation by tilting individual diode-laser bar assemblies, including the corresponding collimating lenses, thereby tilting the substantially-collimated beams with respect to the optical axis. In FIG. 2 the outermost and next-outermost diode-laser bar assemblies are tilted by angles "θ" and "φ" respectively. Focused beams 28A and 28B converge to optical axis 26 at common location 30. Those skilled in the art of optical design would recognize that aberration compensation could also be achieved by combining embodiments 10 and 50 in an optical apparatus that both displaces fast-axis collimating lenses and tilts diode-laser bars.

Aberration compensation can be optimized empirically. For example, in apparatus 10 of FIGS. 1A-C, the aberration compensation can be optimized by actively aligning fast-axis collimating lenses 18 while monitoring optical power transmitted through a tooling aperture located at common focus location 30. Individual fast-axis focusing lenses would be displaced with respect to the diode-laser emitters of the corresponding diode-laser bars to optimize the transmitted power. Alternatively, commercially available optical-design software (such as Zemax™) can be used to pre-calculate the optimum tilt angles of substantially-collimated beams 22 and thereby the optimum displacements of corresponding fast-axis collimating lenses 18. Those skilled in the art of optical design would recognize that aberration compensation can be optimized by various empirical, calculated, and hybrid means.

The embodiments depicted and examples presented herein have a plurality of substantially-collimated beams tilted with respect to the optical axis of the focusing lens. However, some improvement in focusing would be achieved by tilting just one of the substantially-collimated beams in a vertical stack, provided the tilting compensates for spherical aberration imparted onto that beam by the focusing lens.

The present invention is described above in terms of a preferred embodiment and other embodiments. The invention is not limited, however, to the embodiments described and depicted herein. Rather, the invention is limited only by the claims appended hereto.

What is claimed is:

1. Optical apparatus comprising:
a stacked plurality of diode-laser bars, each diode-laser bar having an optical output beam that is substantially collimated in a fast-axis direction of the diode-laser bar by a fast-axis collimating lens;
a single element focusing lens having an optical axis and spherical aberration, the focusing lens intercepting the substantially-collimated beams of all of the diode-laser bars, the stacked diode-laser bars and the focusing lens arranged to bring all of the substantially-collimated beams to focus on the optical axis; and
wherein the substantially-collimated beams of at least one of the diode-laser bars are tilted at angles with respect to the optical axis by displacing the corresponding fast-axis collimating lenses laterally with respect to the propagation direction of the diode-laser emitters of the corresponding diode-laser bars, the substantially-collimated beams being tilted between the fast-axis collimating lenses and the focusing lens, the tilt angles selected such that the single element focusing lens directs all of the focused beams converge to a common focus location on the optical axis.

2. The optical apparatus of claim 1, wherein each optical output beam is substantially collimated in a slow-axis direction of the diode-laser bar by a slow-axis collimating lens.

3. The optical apparatus of claim 1, wherein the substantially-collimated beams of at least two of the diode-laser bars are tilted at angles with respect to the optical axis.

4. The optical apparatus of claim 1, wherein the substantially-collimated beams originating from the outermost diode-laser bars of the stack are tilted with respect to the optical axis.

5. The optical apparatus of claim 4, wherein substantially-collimated beams originating from the next-outermost diode-laser bars of the stack are tilted with respect to the optical axis.

6. The optical apparatus of claim 1, wherein the focusing lens is a plano-convex lens.

7. Optical apparatus comprising:
a stacked plurality of diode-laser bars, each diode-laser bar having an optical output beam that is substantially collimated in a fast-axis direction of the diode-laser bar by a fast-axis collimating lens;
a single element focusing lens having an optical axis and spherical aberration, the focusing lens intercepting the substantially-collimated beams of all of the diode-laser bars, the stacked diode-laser bars and the focusing lens arranged to bring all of the substantially-collimated beams to focus on the optical axis; and
wherein the substantially-collimated beams of at least two of the outermost diode-laser bars of the stack are tilted at angles with respect to the optical axis by tilting the corresponding diode-laser bars, the substantially-collimated beams being tilted between the fast-axis collimating lenses and the focusing lens, at least three other diode-laser bars near the center of the stack are aligned parallel to the optical axis, the tilt angles selected such that the single element focusing lens directs all of the focused beams converge to a common focus location on the optical axis.

8. The optical apparatus of claim 7, wherein each optical output beam is substantially collimated in a slow-axis direction of the diode-laser bar by a slow-axis collimating lens.

9. The optical apparatus of claim 7, wherein substantially-collimated beams originating from the next-outermost diode-laser bars of the stack are tilted with respect to the optical axis.

10. The optical apparatus of claim 7, wherein the focusing lens is a plano-convex lens.

* * * * *